United States Patent
Naftali et al.

(10) Patent No.: US 10,277,873 B2
(45) Date of Patent: Apr. 30, 2019

(54) APPARATUS AND METHODS FOR DIMMING COHERENT LIGHT SOURCES

(71) Applicant: Maradin Technologies Ltd., Yoqne'am (IL)

(72) Inventors: Matan Naftali, Moshav Aloney-Aba (IL); Gad Yearim, Haifa (IL); Adi Baram, Yoqneam (IL); Menashe Yehiel, Moshav Yogev (IL)

(73) Assignee: MARADIN TECHNOLOGIES LTD., Yoqne'Am (IL)

( * ) Notice: Subject to any disclaimer, the term of this patent is extended or adjusted under 35 U.S.C. 154(b) by 170 days.

(21) Appl. No.: 15/416,161

(22) Filed: Jan. 26, 2017

(65) Prior Publication Data

US 2017/0214893 A1    Jul. 27, 2017

Related U.S. Application Data

(60) Provisional application No. 62/287,016, filed on Jan. 26, 2016.

(51) Int. Cl.
*H01S 5/40* (2006.01)
*H04N 9/31* (2006.01)

(52) U.S. Cl.
CPC ......... *H04N 9/3155* (2013.01); *H01S 5/4093* (2013.01); *H04N 9/3129* (2013.01); *H04N 9/3161* (2013.01)

(58) Field of Classification Search
CPC .. H04N 9/3161; H04N 9/3164; H04N 9/3155; H01S 5/4093
See application file for complete search history.

(56) References Cited

U.S. PATENT DOCUMENTS

| | | | |
|---|---|---|---|
| 9,456,172 B2 | 9/2016 | Naftali et al. | |
| 2011/0037781 A1* | 2/2011 | Kangas | G09G 3/3406 345/690 |
| 2014/0104501 A1 | 4/2014 | Jackson | |
| 2016/0314760 A1* | 10/2016 | Jangda | G09G 5/10 |
| 2017/0181242 A1* | 6/2017 | Johnson | H05B 33/0815 |
| 2017/0256192 A1* | 9/2017 | Knepper | G09G 3/2003 |

* cited by examiner

*Primary Examiner* — Muhammad N Edun
(74) *Attorney, Agent, or Firm* — Browdy and NeimarK, PLLC

(57) ABSTRACT

A system and method for providing a dimming factor of N using a laser display device having plural colored laser diodes each generating a colored laser beam according to control parameters. At least one of the control parameters of at least one of the laser diodes is varied, at least one of the control parameters being operative to reduce intensity of at least one of the colored laser beams. Varying may comprise providing a dimming factor of m<N using first laser diode data current control apparatus able to provide m<N dimming levels and a dimming factor of at least N/m<N, using at least a second laser diode data current control apparatus able to provide a dimming factor of at least N/m, but less than N.

20 Claims, 8 Drawing Sheets

Fig. 4

Process a: conventional laser projection system calibration– including generation of GainA_max (used in processes b, c below) for each of color channels r, g and b, and generation of threshold_level and gainb parameters for each of color channels r, g and b

↓

Process b (e.g. according to the operations of Fig. 5): determine the values of 3 prioritized dimming components: df_pw, df_gain and df_div whose product yield the dimming ratio df_total, that is closest to the required dimming ratio and given (by way of example) the priority ordering indicated herein (pixel width > gain > div):

↓

Process c (e.g. according to the operations of Fig. 6): determine the following controller outputs: pixel width, div ratio, the 3 color-components of Gain_CF, GainA and GainB, the 3 color-components of threshold level)

Fig. 5 a. Get required dimming ratio df_total

↓ b. if required df_total is less or equal df_pw max x df_gain max – then b-1. find a (df_pw, df_gain) pair such that abs [ required df_total – (df_pw x df_gain)] is minimum over all possible pairs and in case two or more pairs produce the same minimum – select the pair that enjoys higher priority.

b-2. set df_div = 1

↓ c. else (i.e. required df_total exceeds df_pw max x df_gain max) – then:

find a (df_pw, df_gain, df_div) triplet such that abs [ required df_total – (df_pw x df_gain x df_div) ] is minimum over all possible triplets and in case two or more triplets produce the same minimum – select the triplet that enjoys higher priority

↓ d. if operations b, c are performed in advance for all possible values of required df_total.

a table may be prepared that stores:

all possible total dimming factors (df_t), and for each possible df_t: the three components (df_pw, df_gain, df_div) as determined by operations b, c above.

Fig. 6 e. Pixel_width is generated from df_pw -- as computed in operations b c above.

Pixel_width = pixel_width_max / df_pw div is directly generated in operations b,c above from df_div.

div = df_div

↓ f. the 3 color-components of GainA are computed by plugging the df_gain computed in operations b,c above into:

GainA (color) = roundup [GainA_max(color) / df_gain]

Where GainA_max_R, GainA_max_G, GainA_max_B, used here in operation f and in operation g below, are values generated in the white-balancing operation procedure performed above (process A).

↓ g. the correction factors for R, G, B respectively, due to roundup function in the formula for GainA of R, G, B respectively, are computed e.g. using:

Gain_CF (color) = [GainA_max(color) / DF_gain] / GainA(color) where GainA(color) are the parameters computed in operation f above.

Fig. 7

| (pixel width, gain, div) | (df pw, df gain, df div) | df total | Projection intensity |
|---|---|---|---|
| 4,100,1 | 1,1,1 | 1 | MAX |
| 3,100,1 | 1.333, 1,1 | 1.333 | MAX / 1.333 |
| 2,100,1 | 2, 1, 1 | 2 | MAX / 2 |
| 2,66,1 | 2, 1.5, 1 | 3 | MAX / 3 |
| 2, 50, 1 | 2, 2, 1 | 4 | MAX / 4 |
| 1, 50, 1 | 4, 2, 1 | 8 | MAX / 8 |
| 1, 25, 1 | 4, 4, 1 | 16 | MAX / 16 |
| ... | ... | ... | ... |
| 2, 10, 1 | 2, 10, 1 | 20 | MAX / 20 |
| 1, 10, 1 | 4, 10, 1 | 40 | MAX / 40 |
| 1, 4, 1 | 4, 25, 1 | 100 | MAX / 100 |
| 1,1,1 | 4, 100, 1 | 400 | MAX / 400 |
| ... | ... | ... | ... |
| 1, 1, 2 | 4, 100, 2 | 800 | MAX / 800 |
| 1, 1, 4 | 4, 100, 4 | 1600 | MAX/1600 |
| 1, 1, 8 | 4, 100, 8 | 3200 | MAX/3200 |

APPARATUS AND METHODS FOR DIMMING COHERENT LIGHT SOURCES

REFERENCE TO CO-PENDING APPLICATIONS

Priority is claimed from U.S. Provisional Patent Application No. 62/287,016, entitled "Dimming method for laser scanning displays" and filed Jan. 26, 2016, the disclosure of which is hereby incorporated by reference.

FIELD OF THIS DISCLOSURE

The present invention relates generally to optical devices which use coherent light sources, More particularly, this invention relates to laser based projection devices.

BACKGROUND FOR THIS DISCLOSURE

Use of variable optical attenuators (VOA) to control laser intensity is believed to be known.

U.S. Pat. No. 9,456,172 describes a system and method for correcting optical distortions when projecting 2D images onto 2D surfaces, including a timing algorithm.

The disclosures of all publications and patent documents mentioned in the specification, and of the publications and patent documents cited therein directly or indirectly, are hereby incorporated by reference. Materiality of such publications and patent documents to patentability is not conceded.

SUMMARY OF CERTAIN EMBODIMENTS

Certain embodiments seek to provide an improved method for using coherent light sources e.g. lasers whose intensity is to be controlled or dimmed, without changing the color combination yielded by the plural laser drivers corresponding to plural color components.

Certain embodiments seek to provide a system and method for dimming laser scanning displays e.g. HUDs for vehicles such as cars or aircraft, or wearable HUDs such as masks, goggles, helmets and visors, or any other laser-based projection system, particularly if used in widely varying ambient illuminations e.g. both during the day and during the night.

Certain embodiments seek to provide laser On-Time control which yields laser intensity dimming inter alia by selective reduction of laser effective energy (pixel width).

Certain embodiments seek to provide a dimmable laser display system which achieves dimming by directly reducing the laser power instead of, or in addition to, using a optical element/s downstream the laser diode along the optical path defined by the laser display system, that indirectly e.g. externally or ex post facto reduces a given level of laser projection power when dimming is required.

In some laser based display applications, there is a need to control laser intensity e.g. due to a high level of brightness of the laser source, and/or the high level of variation of background brightness. However, when using several color components together to achieve a color combination, partially changing the intensity of the color components may directly affect the required color.

In previous studies variable optical attenuators (VOA) have been proposed. These VOA block some of the light on its path to the screen, thereby reducing the amount of photons (energy) of the display. However, this method increases overall system cost and requires more space.

This method's effectivity is limited by the system's gray scale resolution (8 or 10 bits in most systems) and is thus not suitable for applications, such as Head-Up-Displays (HUD) for cars which are characterized by a high level of variation of brightness of the HUD's environment (aka surroundings or background). In addition, reducing intensity by data manipulation may be limited in use-cases which are disrupted by the resulting data loss.

According to certain embodiments, any one, any two or all three of the following elements or components or control parameters (or other suitable laser driver control parameters) can independently be used, to control data current to the laser diode, thereby to provide controlled dimming of a laser-based (e.g. laser beam-generated) display:

a) Laser pixel width
b) Laser driver Data Reference DAC (Digital to Analog Converter) gain
And optionally also—
c) Data value division.

Each of the above elements has a limited attenuation ratio which prevents that element, taken alone, from yielding certain high dynamic ranges of dimming. However multiplying these three attenuations, or 2 out of 3 from among them, yields a range for system dimming which is wider than the ranges that might be provided from each of the elements taken alone.

Embodiments may include:

A. A unique architecture composed of plural independently controlled dimming components. The following are presented: Laser pixel width, Laser Driver Data reference DAC gain control and Data value division.

B. A method e.g. as per embodiment A above, which is flexible enough to present up to a dimming ratio factor of, say, 3200 using the numbers presented herein by way of example. This ratio can be increased e.g. when clock rate that generates pixel width is increased (e.g. from 160 Mhz to 250 Mhz), or if the resolution of the gain control of the reference DAC in the data channel is increased for example from 8 bit to 10 or 12 bits, or if the data value division factor is increased (e.g. from 8 to 16). For example, typically, increasing clock frequency increases the dimming ratio roughly by the clock frequency increase ratio.

Increasing resolution of the gain control by a factor of 4 e.g. from, say, 8 to 10 bits increases the dimming ratio by the same factor i.e. 4, or similarly, Increasing resolution of the gain control by a factor of 16 i.e. from 8 to 12 bits typically increases the dimming ratio by a factor of 16. Increasing the division factor from 8 to 16 typically increases dimming ratio by the same factor e.g. by 2 in this case.

So for example, rather than using the parameters used by way of example herein, which achieve a dimming ratio of 1:3200, a much higher dimming ratio such as but not limited to, say, 1:12000 may be achieved e.g. by suitably increasing clock frequency and/or using higher resolution gain control data e.g. 10 bit data rather than 8 bit data.

c. A method e.g. as per embodiment A above, that has a "pixel width" dimming component which utilizes reducing laser On-Time control to reduce effective energy of the laser.

d. A method e.g. as per embodiment A above, that utilizes Data reference DAC voltage control while maintaining the ratio between the three color components (white balance) intact by reducing reference DAC gain, and compensating for the ratio miss by multiplying the pixel data by a CF (correction factor) e.g. Gain_CF in FIGS. 1b-3).

e. A method e.g. as per embodiment A above, that utilizes dither to practically maintain color resolution while reducing dynamic range of the data by data division.

Display devices such as but not limited to HUD applications may require a wide range of dimming e.g. in order to support the HUD's operation in diverse ambient illuminations e.g. in both daylight and nighttime environments.

Certain embodiments seek to provide a new paradigm in dimming methods in cases where a wide range of dimming ratio is required.

Certain embodiments seek to provide a paradigm for dimming/laser power manipulation by reducing laser power consumption, obviating various optical mechanical and/or electrical elements, typically without increasing the cost or size of the display system.

An advantage of certain embodiments is power efficiency because dimming is achieved by reducing the laser power—rather than by using optical devices that reduce projection power without changing the laser power, when dimming is required.

At least the following embodiments are provided:

Embodiment 1a. A method for providing a dimming factor of N using a laser display device having plural colored laser diodes each generating a colored laser beam according to control parameters, the method comprising varying at least one of said control parameters of at least one of said laser diodes, wherein said at least one of said control parameters is operative to reduce intensity of at least one of the colored laser beams.

Embodiment 1b. A method e.g. according to embodiment 1a, for providing a dimming factor of N using a laser display device having plural colored laser diodes, the method comprising providing a dimming factor of m<N using first laser diode data current control apparatus characterized by its ability to provide m<N dimming levels; and providing a dimming factor of at least N/m but less than N, using a laser diode data current control apparatus set including at least a second laser diode data current control apparatus and characterized by its ability to provide a dimming factor of at least N/m, but less than N.

Embodiment 2. A method according to any of the preceding embodiments wherein at least one of the laser diode data current control apparatus includes laser pixel width control.

Embodiment 3. A method according to any of the preceding embodiments wherein at least one of the laser diode data current control apparatus includes Data Reference DAC gain control.

Embodiment 4. A method according to any of the preceding embodiments wherein the first and second laser diode data current control apparatus include laser pixel width control and Data Reference DAC gain control.

Embodiment 5. A method according to any of the preceding embodiments wherein the laser diode data current control apparatus set also includes laser pixel data division.

Embodiment 6. A method according to any of the preceding embodiments and also comprising providing N dimming levels using a laser display device, including receiving, in real time, a stream of desired dimming levels from among the N dimming levels; and achieving each desired dimming level in the stream in real time, including using a first laser diode data current control apparatus characterized by its ability to provide a dimming factor of m<N and a laser diode data current control apparatus set including at least a second laser diode data current control apparatus and characterized by its ability to provide a dimming factor of at least N/m, but less than N.

Embodiment 7. A method according to any of the preceding embodiments wherein when reducing reference DAC gain for each of plural color channels, resulting pixel data is multiplied by a color-channel specific correction factor gain_CF pre-computed to maintain white balance between said channels.

Embodiment 8. A method according to any of the preceding embodiments wherein laser pixel width control is achieved by reducing a number of clocks per laser pixel.

Any suitable processor/s, display and input means may be used to process, display e.g. on a computer screen or other computer output device, store, and accept information such as information used by or generated by any of the methods and apparatus shown and described herein; the above processor/s, display and input means including computer programs, in accordance with some or all of the embodiments of the present invention. Any or all functionalities of the invention shown and described herein, such as but not limited to operations within flowcharts, may be performed by any one or more of: at least one conventional personal computer processor, workstation or other programmable device or computer or electronic computing device or processor, either general-purpose or specifically constructed, used for processing; a computer display screen and/or printer and/or speaker for displaying; machine-readable memory such as optical disks, CDROMs, DVDs, BluRays, magnetic-optical discs or other discs; RAMs, ROMs, EPROMs, EEPROMs, magnetic or optical or other cards, for storing, and keyboard or mouse for accepting. Modules shown and described herein may include any one or combination or plurality of: a server, a data processor, a memory/computer storage, a communication interface, a computer program stored in memory/computer storage.

The embodiments referred to above, and other embodiments, are described in detail in the next section.

Any trademark occurring in the text or drawings is the property of its owner and occurs herein merely to explain or illustrate one example of how an embodiment of the invention may be implemented.

Unless specifically stated otherwise, as apparent from the following discussions, it is appreciated that throughout the specification discussions, utilizing terms such as, "processing", "computing", "estimating", "selecting", "ranking", "grading", "calculating", "determining", "generating", "reassessing", "classifying", "generating", "producing", "stereo-matching", "registering", "detecting", "associating", "superimposing", "obtaining" or the like, refer to the action and/or processes of at least one computer/s or computing system/s, or processor/s or controller/s or similar electronic computing device/s (or any kind of electronic device with data processing capabilities, including, by way of non-limiting example, personal computers, servers, embedded cores, computing system, communication devices, processors (e.g. digital signal processor (DSP), microcontrollers, field programmable gate array (FPGA), application specific integrated circuit (ASIC), etc.) and other electronic computing devices), that manipulate and/or transform data represented as physical, such as electronic, quantities within the computing system's registers and/or memories, into other data similarly represented as physical quantities within the computing system's memories, registers or other such information storage, transmission or display devices.

Elements separately described herein need not be distinct components and alternatively may be the same structure. A statement that an element or feature may exist is intended to include (a) embodiments in which the element or feature exists; (b) embodiments in which the element or feature does not exist; and (c) embodiments in which the element or feature exist selectably e.g. a user may configure or select whether the element or feature does or does not exist.

Any suitable input device, such as but not limited to a sensor, may be used to generate or otherwise provide information received by the apparatus and methods shown and described herein. Any suitable output device or display may be used to display or output information generated by the apparatus and methods shown and described herein. Any suitable processor/s may be employed to compute or generate information as described herein and/or to perform functionalities described herein and/or to implement any engine, interface or other system described herein. Any suitable computerized data storage e.g. computer memory may be used to store information received by or generated by the systems shown and described herein.

Any computerized components shown and described herein may communicate between themselves via a suitable computer network.

BRIEF DESCRIPTION OF THE DRAWINGS

FIGS. 4-6 are simplified flowchart illustrations of methods useful in accordance with certain embodiments of the present invention.

FIG. 7 is a table showing example dimming ratio component triplets (df_pw, df_gain, df_div), dimming control triplets (pixel width, gain, div), and corresponding df_total and projection intensities.

Methods and systems included in the scope of the present invention may include some (e.g. any suitable subset) or all of the functional blocks shown in the specifically illustrated implementations by way of example, in any suitable order e.g. as shown.

Any hardware component mentioned herein may in fact include either one or more hardware devices e.g. chips, which may be co-located or remote from one another.

DETAILED DESCRIPTION OF CERTAIN EMBODIMENTS

Figure 1A:
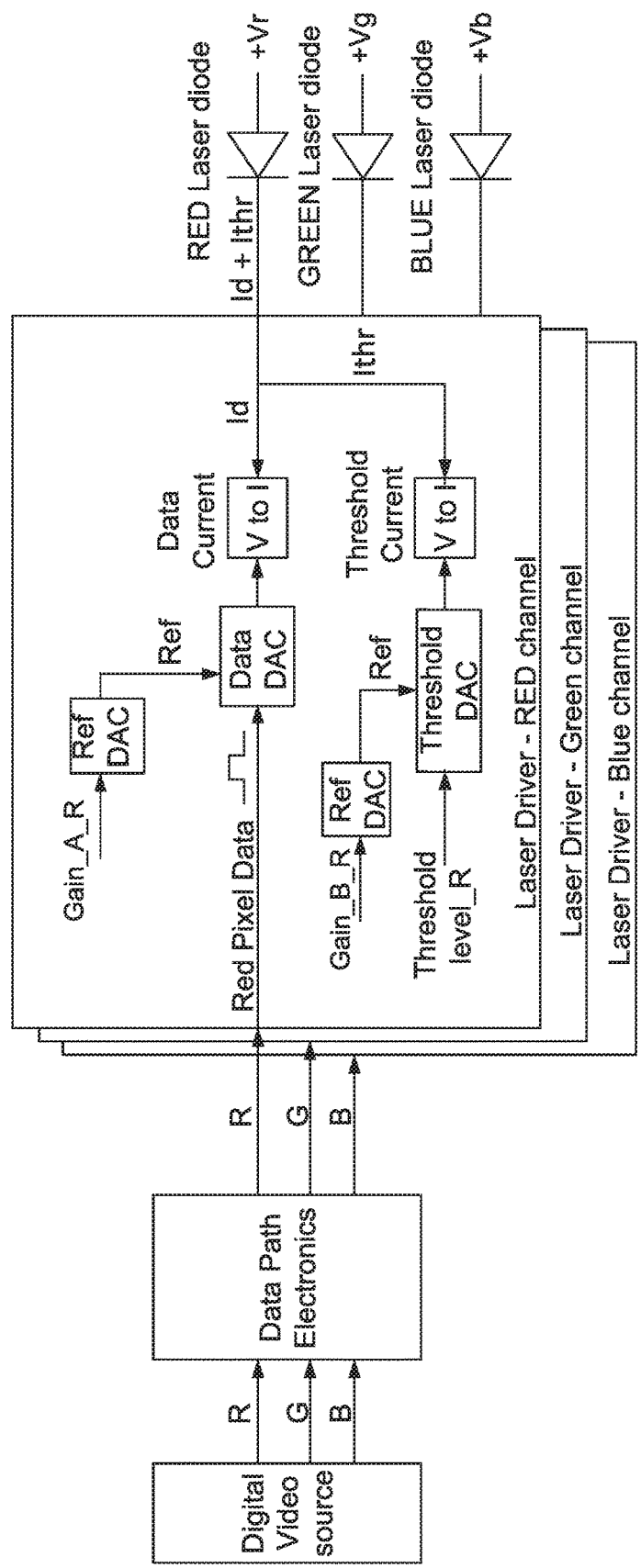
FIG. 1a (prior art) is a simplified block diagram illustration of a Laser projection system.
Figure 1B:
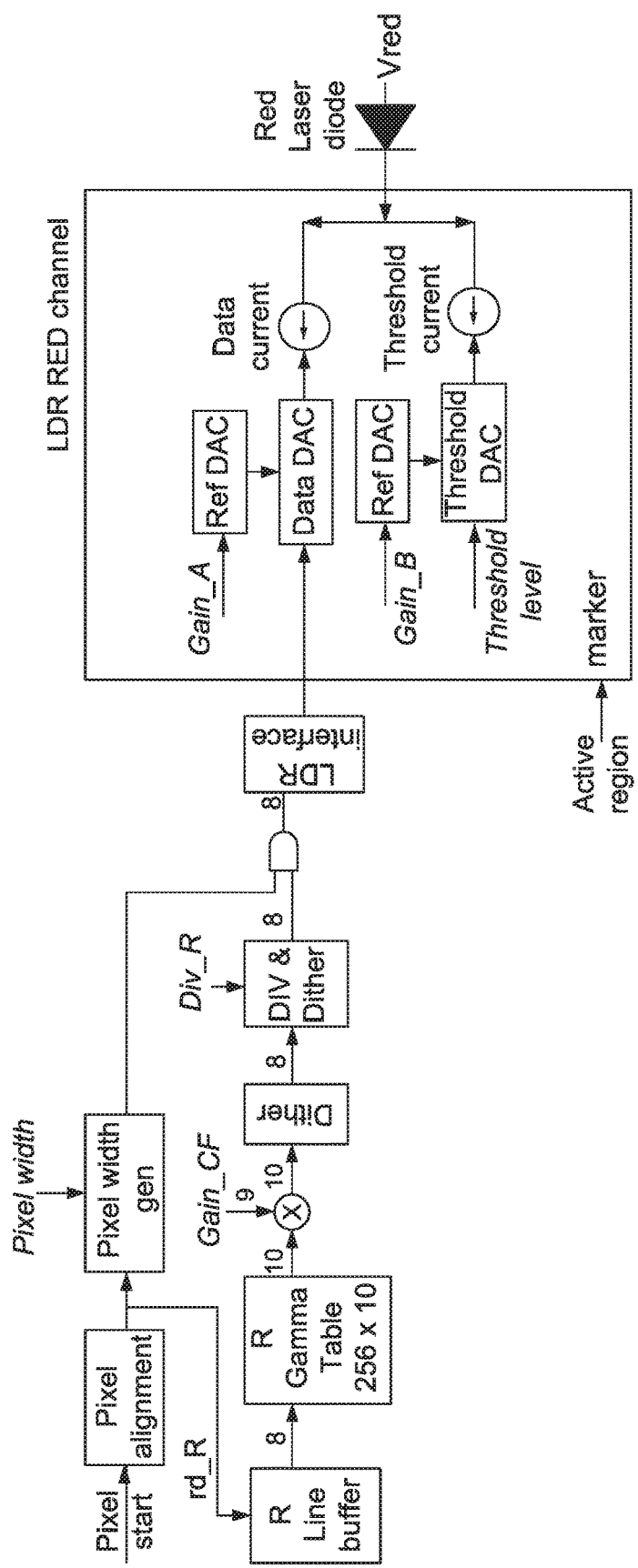
FIG. 1b is a simplified example flow diagram of an example Laser projection system (Red Channel, by way of example) constructed and operative in accordance with an embodiment of the invention.
Figure 2:
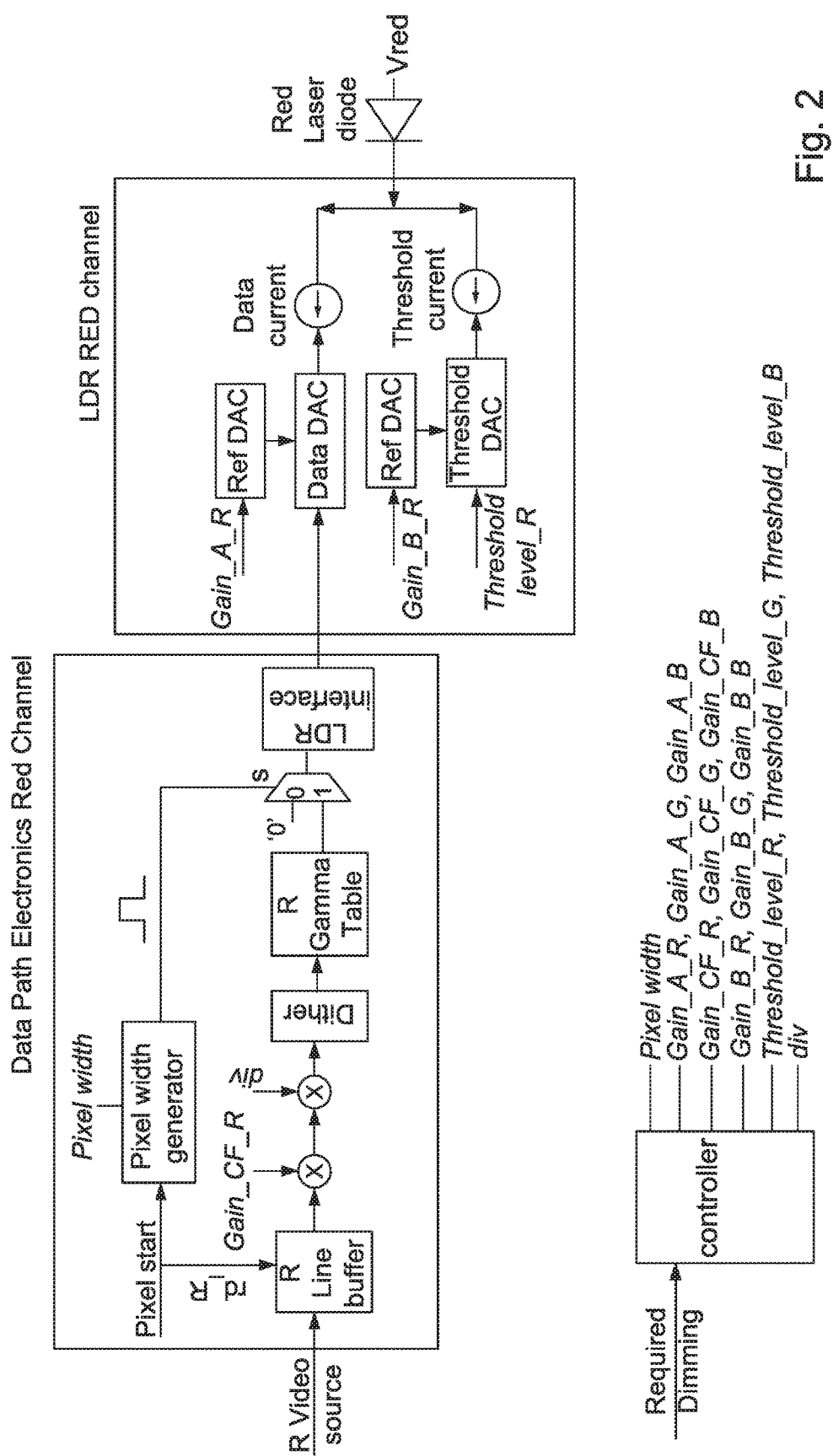
FIG. 2 is a simplified flow diagram of a Laser projection system (Red Channel, by way of example) according to an embodiment of the invention which includes a shift-based (or any more generalized) div function. The div is shown in the diagram as a multiply function for a more generalized form. Multiply by 1/div for division, or by any fraction n/m in general.

A prior art laser driver's data path to its laser diode is shown in FIG. 1a. Conventionally, laser diode current is composed of threshold current (Ithr), and data current (Id). Threshold current is constant along the entire active display region. Data current is provided in pulses, one pulse per pixel. For each pixel the data current value is proportional to the pixel data (8 bit resolution in the example) provided by the digital video source. The laser driver chip (such as but not limited to Maxim's MAX3601 or Intersil's ISL58365) generates these two current components using Data DAC and Threshold DAC. Each one of these two DACs is typically connected to a reference DAC (aka the data reference DAC and threshold reference DAC respectively) that generates the reference voltage for that DAC. Data reference voltage is connected to Data DAC, and Threshold reference voltage is connected to threshold DAC. Data DAC and Threshold DAC are typically connected to voltage to a current (V to I) converter, which generates the Data current and Threshold current, respectively.

According to certain embodiments, a Gain A parameter controls the Data DAC reference voltage and a Gain B parameter controls the threshold DAC reference voltage, all e.g. as is known in the art and/or described in detail herein. These parameters may be determined by a controller or CPU which receives a required dimming factor within a dynamic range of dimming factors extending, say, from 1 to 3200, as input.

To control the projector's dimming, typically, the data current to the laser diode is controlled but not the threshold current.

Some or all of the following 3 elements or components can independently be used to control data current to the laser diode, thereby to provide controlled dimming, e.g. as described in detail below:

a) Laser pixel width
b) Data Reference DAC gain also termed "Gain_A" herein.
c) Data value division.

It is of course appreciated that the number of components proposed above to be used to achieve dimming is 3, but this is entirely independent of the number of color channels which coincidentally also happens to be 3.

Each of the above elements has a limited attenuation ratio, aka dimming ratio, which prevents that element, taken alone, from yielding certain high numbers of dimming levels. However multiplying these three attenuations, or 2 out of 3 from among them, yields a range for system dimming which is wider than the ranges that might be provided from each of the elements taken alone.

When changing the dimming, typically only data current is varied, whereas threshold current remains constant irrespective of the required dimming level at time t. However, any mis-calibration of the threshold level will be much more noticeable for high dimming (in which low data current flows to the laser diode yielding a darker image) when the background light is very low. Therefore auto threshold current recalibration may be employed, as is conventional. This type of state of the art laser projection system has auto calibration procedures; due to the laser diodes' sensitivity to temperature change, calibration of threshold current and white balance is usually performed automatically—with and without dimming Laser Pixel Width:

Laser pixel width can be controlled with a resolution determined by the data path clock. For example, given a 160 Mhz data path clock this resolution may be 6.25 nanosec (ns). Decreasing the number of clocks per pixel reduces projection intensity linearly. For 854 pixels/line, the minimum distance between two consecutive pixels using a 10 Khz mirror corresponds to 5 clocks, if it is desired to reduce pixel contamination on image edges. Providing a maximum value of 4 clocks rather than 5 allows a one clock gap between consecutive pixels to be maintained. In this case, up to 4 levels of dimming can be achieved by reducing pixel width from 4 clocks down to 1 clock, i.e. reducing intensity in 4 stages i.e. up to a maximum laser pixel intensity reduction ratio of 4.

All numbers appearing should merely be considered as examples, for reasons of clarity. For example, clock rate may be increased (from 160 Mhz to 250 Mhz) to add more controlling steps to the pixel width. It is appreciated that increasing the number of pixels per line, without changing the clock frequency, decreases the number of clocks per pixel, decreasing the number of possible intensity reduction levels.

According to certain embodiments, a suitable timing algorithm is used to "spread" pixels on the display surface and using the interval between the pixels, the clocks may be determined. e.g. using the timing algorithm described in U.S. Pat. No. 9,456,172.

Data Reference DAC Gain:

Reducing DAC_A gain, aka data reference DAC gain, at the LDR (laser driver) will reduce the reference voltage to Data DAC, increasing the dimming. It is appreciated that "DAC_A gain" is a term used in a particular laser driver specification (the MAX3601). However, any other suitable laser driver may be employed such as the ISL58365 laser driver. The term "DAC_A gain" as used herein refers to any laser driver's parameter which governs the reference voltage of the data DAC (aka color DAC), whereas the term "DAC_B gain" as used herein refers to any laser driver's parameter which governs the reference voltage of the threshold DAC aka base current DAC.

DAC_A Gain, in conventional laser drivers, is a digital value (8 bit in this example), which by changing its value can reduce DAC_A reference voltage from a maximum value set during a white balance calibration process, down to 1.

The white balance calibration process is typically executed at the factory site during projection system calibration, and can also be executed (e.g. redone) in the field, in real time or manually, in the course of normal operation to compensate for changes in laser diodes' optical power changes e.g. due to temperature or aging.

For example, a set of R,G,B laser diodes are found to produce maximum light intensity at a white-balanced image, when the DAC_A Gain setting is 100, 140 and 110 for the R, G and B laser diodes respectively. For maximum dimming, the minimum gain setting of red channel DAC_A can be changed down to 1. Thus the Gain may be reduced by a factor of 100—increasing the dimming ratio by a factor of 100.

For any given dimming setting—DAC_A Gain is typically reduced for all three color components by the same ratio or, e.g. as described herein, by a triplet of ratios, one per color, suitable for maintaining white balance e.g. if different white balances have been calibrated for each of several intensities of white. However, reducing DAC_A Gain using (say) the same ratio at all three color components may require rounding which may cause deviation from white balance. For example: if at full gain, DAC_A Gain for red is 100 and DAC_A Gain for green is 140 and for blue is 110, increasing dimming to 100 will yield DAC_A Gain=100/100=1 for the red, which does not require rounding, but will yield 140/100=1.4 for green and 110/100=1.1 for blue, both of which may require rounding. However, if indeed values rounded to the nearest integer e.g. 1 or 2 are set for the green and blue laser diode's DAC_A Gain respectively, this slightly disturbs the white balance.

According to certain embodiments, the green and blue DAC_A Gain values are (using the above example) rounded up from 1.4 and 1.1 respectively to the closest greater integer which is 2 (typically, to facilitate compensation using a correction factor, the values are rounded up so the correction factor is a number less than or equal to 1). Then, suitable external electronics e.g. ASIC or FPGA that implement the pixel data flow may be used e.g. as shown in FIGS. 1b-3, to multiply each channel pixel value by its correction factor. Continuing with the above example, the green channel pixel data may be multiplied by a correction factor (gain_cf_g) of 1.4/2=0.7 and the blue channel pixel data may be multiplied by a correction factor (gain_cf_B) of 1/1.1=0.909. The controller or CPU may compute Gain_A and the gain correction factor for each channel, and load these values to the LDR data reference DAC and to the correction multiplier in the data flow electronics.

All numerical values stipulated appearing herein are of course merely by way of example.

Data Division:

According to certain embodiments, to increase dimming, the dynamic range of the data may be reduced by pixel data division. Dither may be employed to maintain perceived color resolution despite the reduced dynamic range and resolution caused by data division.

Pixel data (or just data) may for example be 8 bit resolution per color component at the video source and at data DAC input (or there may be a higher resolution—10 or even 12 bits). One method of reducing intensity (increasing dimming) is by dividing the pixel data by a div factor. However, dividing the data reduces dynamic range, and details from the data input are omitted, hence lost. If, for example, data input is divided by 2, the input dynamic range 0-255 is reduced to 0-127, and the l.s. (least significant) bit of data input is lost. If data input is divided by 8, the reduced dynamic range is 0-32, and 3 l.s. bits of data input are lost.

Suitable dither techniques, such as but not limited to temporal dither and spatial dither, can then be used to reduce the visible effect of the lost bits.

Implementation of dynamic range reduction can be effected either by shifting of the pixel data value—an operation that implements division of pixel value by 1, 2, 4 ,8 etc, or, more generally, by multiplying the pixel value by a ratio n/m where m and n are positive integers, n<=m. Pixel division is a special case of pixel multiplication by a ratio n/m, in which m=8 and n=1, 2, 4, 8. The description below presents pixel division by shift function by way of example.

It is appreciated that whereas in some laser drivers, laser pixel width and data value division are determined first, in parallel, followed by the gain, this need not be the case.

Instead, the width, gain and division may be determined in any other order, sequentially or in parallel or any combination of these.

So, again using the above mentioned numbers merely for illustrative purposes, the dimming ratio (aka dimming factor) can be controlled using some or all of (e.g. any subset of) the following independent components, each shown with an example dimming factor achieved thereby:

Pixel width: max achieves dimming factor of, say, 4
DAC_A gain: max achieves dimming factor of, say, 100
Data div: max achieves dimming factor of, say, 8

The total possible dynamic range for dimming is, then, 4×100×8=3200 if the first, second and third components above are respectively used to vary dimming by a factor of 4, 100 and 8 respectively. Within this range, plural dimming levels may be provided e.g. as described herein.

It is appreciated that optionally, a suitable priority scheme may be employed by assigning a suitable priority to each of the above independent dimming components. For example, width and gain may have highest and medium priorities respectively, or vice versa, and the data division dimming component may have lowest priority, or any other use-case specific priority may be implemented.

In certain use cases, div is lowest priority because detail is lost thereby due to reduced pixel resolution, even in conjunction with dithering technology. Therefore, when possible, use of div as a dimming component may be avoided, by virtue of this priority scheme. Between gain and pulse width, pulse width may, in certain use cases, be assigned the higher priority, since pulse width may cause no data to be lost and does not require reducing laser current and compensating pixels.

The term "priority" is intended to include preference for using a certain dimming component x over another dimming component y, if only one of x and y suffices to provide a required dimming ratio or a required dynamic range for dimming. For example, if pixel width has a higher priority than data division, then a use case which requires at least 300 dimming levels would be achieved using pixel width and gain (which in the above numerical example yields 4×100=400 dimming range), rather than using data division and gain, which in the above numerical example yields 100×8=800 dimming range.

Figure 3:
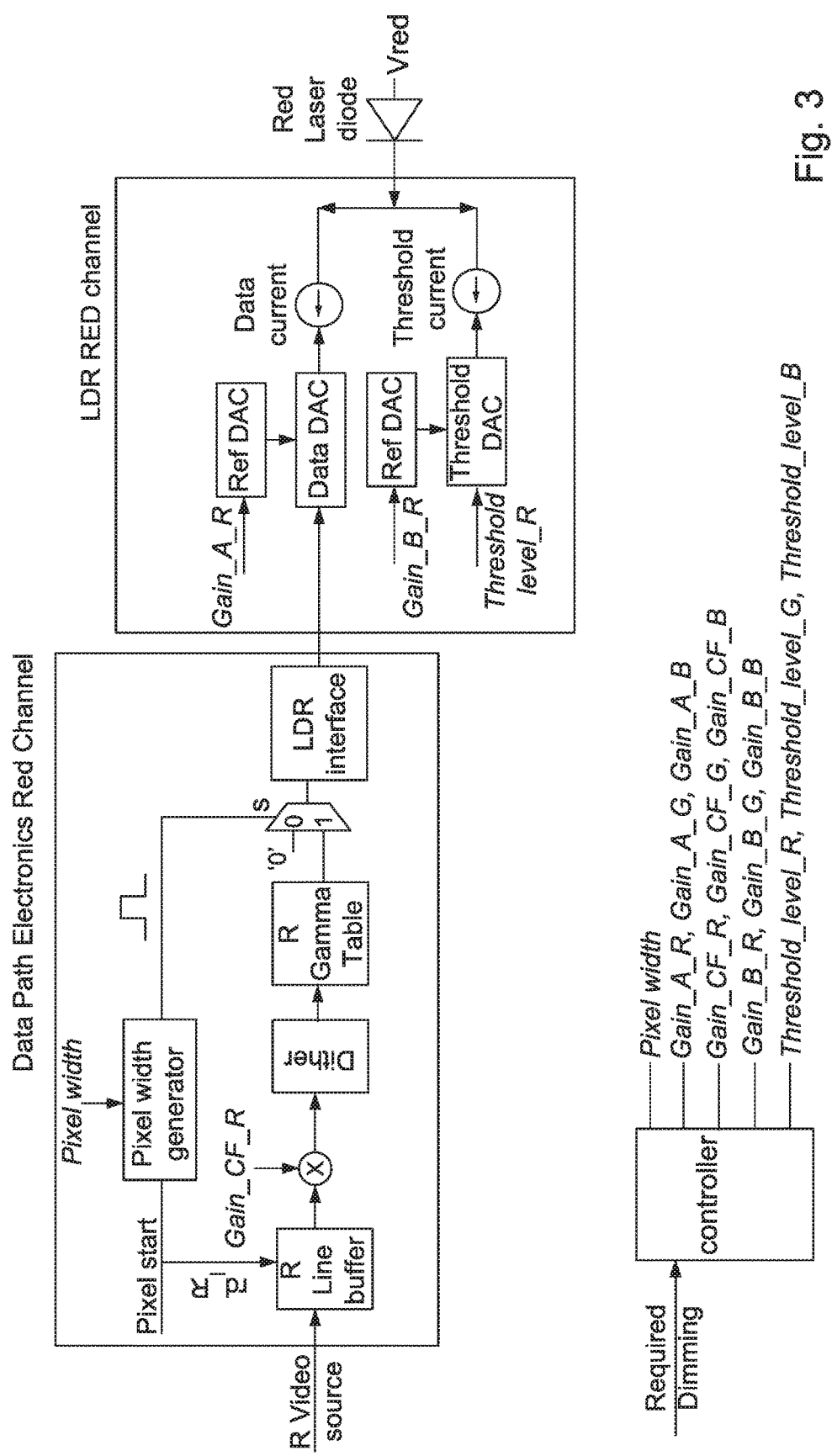
FIG. 3 is a simplified flow diagram of a Laser projection system (Red Channel, by way of example) according to an alternative embodiment of the invention in which the div function is omitted.

When Data div is not used, e.g. as shown in FIG. 3, dimming may be accomplished without reducing the input resolution of 8 bits. When data div is used, the effect of input resolution reduction is reduced by using dithering.

Increasing the data path processing clock, using laser driver with more gain control bits or increasing the number of bits/pixel will allow even higher dimming range.

According to certain embodiments, e.g. as shown in FIGS. 1b-3, the System Architecture may include a digital video source (e.g. data file of an image which a laser-based display system is to present to a human viewer) providing RGB values respectively, to the data path electronics (e.g. FPGA, ASIC) provided for each of the R, G and B channels respectively e.g. as shown in FIGS. 1b-3. The electronics interfaces via an LDR interface with the R, G and B channels of the laser display system's laser driver. The electronics as shown receive some or all of the parameters shown as being generated, by a suitable controller or CPU, typically as a function of a required dimming input. The dimming input may arrive from any external source such as but not limited to a processor associated with an ambient light sensor which determines a suitable dimming level for each environmental light intensity level sensed by the ambient light source. Typically, the pixel width and the div parameters generated by the controller or CPU are uniform for all 3 channels (color components) whereas the remaining parameters (gain A and gain B, gain correction factor, and threshold level) are typically, although not necessarily, generated separately for each of the 3 channels R G and B.

The laser diodes then generate the suitably dimmed laser image, for the laser based projection system such as but not limited to car-mounted head-up display, or other head up display, or any laser based display system which benefits from provision of a multiplicity of dimming levels, such as a display system, which operates in conditions of ambient light which vary from very bright sunlight, to very dark. It is appreciated that often, high intensity displays i.e. displays insufficiently dimmed, cause an unpleasant user experience when used at night, whereas displays which are too dim i.e. too low intensity, cannot be properly seen if the ambient illumination is very bright e.g. if the display is on a car windshield in conditions of direct strong sunlight.

FIGS. 1b-3 exemplify data flows to achieve the dimming function, according to certain embodiments. FIGS. 1b-3, for simplicity, illustrate only the red channel component of the data flow, and the green and blue channels may also be as shown, mutatis mutandis. For example, in the green component, parameters like rd_R or gain_CF_R, the R gamma table, the R video source, the R line buffer may be respectively replaced by parameters like rd_G or gain_CF_G, a G gamma table, a G video source, a G line buffer respectively, and so forth. Italics are used to signify parameters that may be written by the controller or CPU. The LDR (laser driver) interface typically comprises the interface of the pixel stream. Typically, certain or all LDR parameters (Gain, . . . ) are written to the LDR through a separate control channel (not shown). The rd_R input signal may be provided to command the driver to read one pixel from the line buffer which stores a line of video pixels (R/G/B). Optionally, an active region input signal is provided to the LDR (laser driver) which marks the active display; outside this area the LDR is commanded by this signal to drop the laser current to zero.

If the digital video source provides, say, 8 bit data, the Pixel start may comprise a one clock pulse defining the beginning of each pixel. A Gamma table may be provided which typically compensates for non linearity of projection intensity to the human eye, and can also be used for other purposes such as contrast enhancements and white balance at plural grey levels. The Gain_CF typically multiplies each pixel for compensating white balance error due to roundup of DAC_A Gain as described. Div & Dither block typically implements pixel division e.g. by 2, 4 or 8 as described thereby to provide dimming by a factor of up to 8 by pixel shift function (or by a more general function), and the dither function reduces artifacts due to the div function and pixel multiply with Gain_CF.

According to certain embodiments, a total dimming factor range extends from, say, 1 (no dimming) to a maximum dimming. For any required total dimming factor a user may select the three dimming components, while keeping to the dimming component priority scheme, if any.

The total dimming factor (DF) may be described as
  DF_t=DF_pw×DF_gain×DF_div
Where:
DF_t is the total dimming
DF_gain is dimming generated by DAC_A with proper correction e.g. the dimming factor to be realized by DAC_A gain with correction factor gain_CF as described herein.
DF_div is data div dimming=div, the factor by which the pixel data is divided. Example: DIV=1, 2, 4, 8 (4 possible values, where Div=1 represents no data division, a value that may have priority over the other values—2, 4 and 8).
DF_pw is the pulse width dimming which may be described as DF_pw=pw_max/pw, where:
pw_max is the maximum pulse width (e.g. 4 in the example described herein)
pw is the selected pulse width, range 1 till pw_max.
In the example used herein, DF_pw has only 4 possible values.
Given possible DF_gain values, which may be user-defined, color component-specific values for DAC_A gain and gain_CF may be employed to achieve the required DF_gain without disturbing the white balance between the color components (R,G,B), e.g. as follows:

GainA(color component)=roundup [GainA_max(color component)/DF_gain]

Gain_CF(color component)=[GainA_max(color component)/DF_gain]/GainA(color component)

GainA_max(color) is DAC_A gain max value of a specified color component which provides white balance at the maximum projection intensity.

GainA(color) is the actual gain value to load to the DAC_A of the specified color component, and typically has a possible range of 1 to GainA_max(color).

Gain_CF(color) is the correction factor to multiply the pixel data value, compensating for the roundup function and typically has a value range of between 0.5 to 1.

Typically, each dimming factor component has, practically speaking, a limited number of possible values. Therefore, the total dimming factor DF_t has a limited number of possible values (e.g. 4×100×4=1600 possible values in the example described). Of these, if a priority scheme is used, further values are eliminated. Given a priority scheme, a table may be prepared to reflect the possible total dimming factors (DF_t), and for each possible DF_t the three components DF_pw, DF_gain, DF_div that satisfy the priority scheme. A possible dimming factor closest to a specific use-case requirement may then be selected from the table.

Any suitable method may be employed to generated the outputs of the controller shown in FIGS. 1b-3, such as but not limited to the method of FIG. 4. The method of FIG. 4 may include some or all of the following processes A-C, suitably ordered e.g. as shown, and each of these may include some or all of the operations described herein, again suitably ordered e.g. as shown in FIGS. 5 and 6 for processes B, C respectively.

The input to the method of FIG. 4 may comprise a required high or maximal dimming ratio for laser projection, e.g. higher than 1000, such as 3000 or 4000 for example. Certain embodiments herein then allow a full laser diode projection intensity, a fully reduced intensity of 1/3200, say, of the full intensity, and plural "possible" reduced intensities in between, e.g. as described herein. For example, typically, if the dimming ratio is achieved using 3 dimming components each having a maximal dimming ratio value, and the third component is defined as the lowest priority component, then the third component always has its lowest (minimal) value (e.g. div dimming=1 in the example herein), unless both higher priority components have their maximal value (e.g. 25 and 4 in the numerical examples herein for dimming factors of gain and pulse width respectively) and the dimming ratio exceeds the product of the two higher priority components. Therefore, an intermediate dimming ratio that can only be achieved using non-maximal values for the 2 higher priority components (say 20 and 3), and a non-minimal value for the lowest priority component (say div=4 rather than div=1), may be defined as "not possible".

In the present specification, if a required dimming factor can be achieved only by using all three components, and it is below the two higher priority components—this is not deemed an "impossible" value. Although it is a lower priority, it is a possible value. In contrast, the term "impossible" dimming factor implies that there is no combination of dimming components that can produce the required dimming, e.g. a required dimming of 101 as described in an example herein, which cannot be realized by any combination of dimming components.

In the above example, given a required dimming ratio of 3200, an intermediate dimming ratio of 480 may be deemed "not possible" if it can be achieved only by the "impossible" triplet of 2×20×4 which contradicts the prioritization order, and cannot be achieved by setting div=1.

The outputs of the method of FIG. 4 typically comprise some or all of the following outputs of the controller in FIGS. 1b-3, namely some or all of:
pixel width, div,
the 3 color-components of gainA, gainB and gainCF—total 9 parameters
and the 3 color-components of threshold level, Processes A, B and C of FIG. 4 are now each described in detail.

Process A comprises conventional laser projection system calibration—including generation of GainA_max (used in processes B, C below) for each of color channels R, G and B, and generation of Threshold_level and GainB parameters for each of color channels R, G and B.

Conventionally, laser projection system calibration includes:

a. white balance max calibration : the laser driver is adjusted such that when input pixel value is maximum, the laser diodes generate the maximum "allowed" white color intensity.

A "Maximum" pixel value is a pixel digital value that leads to max white color. For example, if each color component is represented by 8 bits the maximum pixel values for the red green and blue components are 255,255,255 decimal, respectively.

"allowed" is defined as the lower of the following 2 maxima:
maximum current limitations of the laser diodes, or
laser diodes' current that produces the maximum allowed projection intensity.

b. threshold level calibration: when pixel input value is minimum, the laser current threshold level is adjusted for zero projection intensity.

A "minimum" pixel value is a black pixel, whose digital pixel values are usually 0,0,0 for its red green and blue color components respectively.

The term "DAC_A" is used herein to denote the DAC (digital to analog converter) that produces the voltage to generate the laser diodes' data current (aka color current). The data current is the current that is proportional to the pixel digital value (for example—for 8 bits 0 may be black, 255 decimal may be max value); it is appreciated that in some systems, black may be another value such as 16 and the max value may be another value such as 240 decimal.

The term "DAC_B" is used herein to denote the digital to analog converter that produces the voltage to generate the laser diodes' threshold current (aka base current). The threshold current is the current that causes the laser diode to start emitting light.

Typical triple laser driver ICs usually implements these DACs, however while in the MAX3601 (Maxim) laser driver these DACs are indeed termed VIDEO DAC A and VIDEO DAC B (FIG. 10 in the MAX3601 data sheet), in other laser drivers other names are used. For example, in ISL58365 (Intersil) these DACs are termed the COLOR DAC and THRESHOLD DAC (FIG. 5 in the ISL58365 data sheet).

A laser projection system calibration usually starts with threshold level calibration including adjustment of DAC_B inputs for all three color components. Calibration is realized by increasing the threshold current of the laser diodes to the maximum values that still produce zero chromaticity and zero intensity. Typically, either a suitable threshold_level is initially set, including Threshold_level_R, Threshold_level_G, Threshold_level_B, and GainB (including GainB_R, GainB_G, GainB_B) is then the maximum gainB value that still produces zero chromaticity and zero intensity. Or, alternatively, GainB (including GainB_R, GainB_G, GainB_B) is initially set, and the threshold_level, including Threshold_level_R, Threshold_level_G, Threshold_level_B, is then the maximum threshold value that still produces zero chromaticity and zero intensity. Either way, the 3 color components of the output threshold and gainB values generated by the threshold level calibration process are used as the Threshold_level and GainB parameters for each of color channels R, G and B in FIG. 1b-3.

White balance max calibration, which typically is done next, involves adjustment of DAC_A GainA inputs (GainA_R, GainA_G, GainA_B) for zero chromaticity and maximum allowed white color intensity. The output GainA_R, GainA_G, GainA_B of this process are used here in below in processes B, C, as the R, G and B color components, respectively, of the GainA_max parameter.

Typically threshold level calibration and white balance calibration procedures are repeated one or more times to ensure good results.

Process B determines the values of 3 prioritized dimming components: df_pw, df_gain and df_div whose product yield the dimming ratio df_total, that is closest to the required dimming ratio and given (by way of example) the priority ordering indicated herein (pixel width>gain>div). As shown in FIG. 5, the process may include some or all of the following operations, suitably ordered e.g. as shown:

a. Get required dimming ratio df_total
b. if required df_total is less or equal df_pw max×df_gain max—then
b-1. find a (df_pw, df_gain) pair such that abs [required df_total−(df_pw×df_gain)] is minimum over all possible pairs
b-2. set df_div=1
c. else (i.e. required df total exceeds df_pw max×df_gain max)—then:
find a (df_pw, df_gain, df_div) triplet such that abs [required df_total−(df_pw×df_gain×df_div)] is minimum over all possible triplets It is appreciated that operations b, c may be performed in advance for all possible values of required df_total.

Then, a table may be prepared that stores:
all possible total dimming factors (df_t),
and for each possible df_t: the three components (df_pw, df_gain, df_div) as determined by operations b, c above.

It is appreciated that not all required df_total values will be able to be realized, and the actual df_t as defined by df_t=df_pw×df_gain×df_div will be the closest actual dimming ratio to the required dimming ratio.

EXAMPLE 1 when required df_total=2, and given the priority ordering indicated herein (pixel width>gain >div), then df_pw=2, df_gain=1 and df_div=1, or (2,1,1) triplet.

(1,2,1) or (1,1,2) triplets are also possible options that produce df_t=2, if the priority ordering between the components is different (e.g. if dimming by pulse width is not the highest priority component).

EXAMPLE 2 when required df_total=8, and given the priority ordering indicated herein (pixel width>gain>div), then df_pw=4, df_gain=2 and df_div=1, or triplet (4,2,1).

Other options like (1,4,2) may be used in embodiments in which the priority ordering between the components is different (e.g. in which dimming by pulse width is not the highest priority component).

EXAMPLE 3 when required df_total=101, the triplet (4,25,1) generates df_t=100, which is the closest realized dimming ratio to the required dimming ratio df_total. This may be used since typically, less than all required dimming ratios in the range 1 to 3200 can be realized.

Generally, it is appreciated that for each dimming component in the triplet, there is a set of possible values. For example:

i. If the possible pixel widths are 1, 2, 3, 4 then the possible values for df_pw are 1, 1.3333, 2, 4 because 4/1=4, 4/2=2, 4/3=1.3333, 4/4=1.

ii. If gainA=1, 2, 3, 4 . . . and assuming GainA_max=100, the set of possible values for df_gain is the set of roundup 100/n values for n=1, . . . 100. In other words, the set would include 100 (=roundup 100/1), 50 (=roundup 100/2), 34 (=roundup(100/3), 25, 20, 17, . . . 4, 3, 2, 1.

iii. If the possible div values are 1, 2, 4, 8 then the possible dfpw values are also 1, 2, 4, 8.

Since some values are not possible, according to the above embodiment, there are certain values for df_total that are "impossible". For example, given a range of 1 to maximum dimming (say, 3200 in the example herein), less than 3200 dimming ratios (df_t) are possible e.g. only those df_t values that can be generated from the possible (df_pw, df_gain, df_div) triplets (as a product of the 3 components e.g.). "Possible" triplets include those triplets that can be generated by pw (pulse width, range 1, 2, 3, 4 in the example), gainA (DAC_A gain: 1, 2, 3, 4 . . . 100 in our example) and div (1, 2, 4, 8 in the example).

By way of example, in the above example, a maximum dimming ratio of 3200 can be realized by the following triplet: (df_pw=4, df_gain=100, df_div=8). However, going below this dimming ratio, the next lowest dimming ratio that can be possible is 1600, which is possible by virtue of the following triplet: (df_pw=4, df_gain=100, df_div=4). Therefore, all dimming ratios from 1601 till 3199 cannot be realized and are impossible. However, a value just above or just below an impossible value that may be desired or required, may be used for df_total. It is appreciated that due to the human eye's ability to discern fractional changes, having a dimming level corresponding to a ratio of 3200, followed by a dimming level corresponding to a ratio of 1600 satisfies most requirements and use-cases.

Extra resolution for dimming ratios may be provided e.g. if the div function provides more ratios than described elsewhere herein e.g. rather than merely being able to divide by 1, 2, 4, 8, it is possible to generate, by using the div function, other ratios: e.g. 1, 2, 4, 6, 8, which facilitates provision, say, of df_t=2400.

Therefore, it is appreciated that the div component used to provide dimming need not be limited to simple division by a factor 2^n (need not comprise a shift function as described elsewhere herein). Instead, the div function may be implemented by multiplying the pixel value by any fraction with any resolution. For example: the div function may multiply by n/10, n=1,2,3, . . . 10 for 10 fraction values or more generally the div function may multiply by n/m, where m=the number of steps, and n=1, 2, 3, . . . m. In a div function implemented by a shift function as described elsewhere herein: m=8, and n=1, 2, 4, 8 (skipping n=3, 5, 6, 7).

Thus according to certain embodiments, the illustrated apparatus includes, alternatively to or in addition to multiplication of the pixel value by a correction factor gainCF, another multiplication that implements the generalized div function described above, thereby to yield a higher dimming resolution if appropriate for certain use-cases.

Process C typically yields the following controller outputs: pixel width, div ratio, the 3 color-components of gainA, gainB and gainCF, the 3 color-components of threshold level). As shown in FIG. 6, the process may include some or all of the following operations, suitably ordered e.g. as shown:

e. Pixel_width is generated from df_pw–as computed in steps b c above.

Pixel_width=pixel_width_max/$df\_pw$ div is directly generated in operations b,c above from df_div.

div=df_div f. the 3 color-components of GainA are computed by plugging the df_gain computed in operations b,c above—into the following formula for GainA (color):

GainA(color)=roundup[GainA_max(color)/$df\_gain$]

In other words:

GainA_R=roundup[GainA_max_R/$df\_gain$]

GainA_G=roundup [GainA_max_G/$df\_gain$]

GainA_B=roundup [GainA_max_B(/$df\_gain$]

Where GainA_max_R, GainA_max_G, GainA_max_B, used here in operation f and in operation g below, are values generated in the white-balancing operation procedure performed above (process A).

g. the 3 color-components of GainCF—which are the correction factors for R, G, B respectively, due to roundup function in the formula for GainA of R, G, B respectively, may be computed using the following formula:

Gain_CF (color)=[GainA_max(color)/DF_gain]/GainA (color) where GainA (color) are the parameters computed in operation f above.

In other words:

GainCF_R=[GainA_max_R/$df\_gain$]/GainA_R

GainCF_B=[GainA_max_G/$df\_gain$]/GainA_G

GainCF_B=[GainA_max_B/$df\_gain$]/GainA_B

It is appreciated that a div value greater than 1 typically will be used only if high dimming factors are needed, since priority is given to lower div ratios. In other words, other than for unusually high dimming ratios exceeding the product of the first two dimming components, DIV=df_div=1. The div value, if greater than 1, defines the division of pixel data by 2, 4 or 8 (i.e. 1, 2, 4, 8 may be possible values), where dithering is typically used to mitigate the adverse effect of reduction in pixel dynamic range.

It is appreciated that any suitable number of dimming levels, at any suitable intervals between them e.g. equidistant levels, may be provided from a given maximum intensity to a given minimal intensity (i.e. maximum intensity divided by the required dimming ratio). In other words, while there may be a fairly large set of possible triplets of values that the 3 dimming components can have, it is possible that the actual dimming levels provided will be a suitable subset of this fairly large set e.g. a subset may be selected to be equidistant or a subset of levels selected to have small intervals between some levels (say, the lowest levels) and large intervals between other levels (say the highest dimming levels), or vice versa. For certain use cases a subset of levels might be selected to have small intervals between its intermediate levels and large intervals between its peripheral (highest and lowest) levels. More generally, all dimming levels corresponding to all possible triplets or n-tuples of components (if 3 or n dimming components are used) may be provided, or any suitable subset thereof. For some use cases, for example, it may be desired for the subset of dimming levels to include many closely spaced levels (high resolution) in the dark "region" intended for nighttime, and relatively few more widely spaced (low resolution) levels in the light "region" intended for day-time.

It is appreciated that typically, the difference between laser intensity levels when adjusting the dimming, is not equal. For example: if the max intensity is 100 lumen and the min intensity is 1 lumen, reducing intensity by 0.5 lumen may not even be noticed for low dimming ratios such that the intensity is very close to the maximal 100 lumen setting, although this same reduction of 0.5 lumen is noticeable at intensities close to the minimal, 1 lumen setting. Therefore, according to certain embodiments, rather than providing equal difference between dimming levels, or settings of the dimming factor, unequal differences are provided e.g. large differences between high intensity levels, as opposed to small differences between low intensity levels. Example: 6 dimming levels may be provided, including a MAX laser intensity i.e. no dimming, followed by dimming levels of approximately ¾, half, one-third, one-quarter and one-eighth of the max laser intensity respectively.

The dimming ratio actually provided may be the ratio, given the dimming components and priority therebetween that are available, that is closest to a desired/required dimming ratio or the ratio that is closest to, yet larger than, or closest to, yet smaller than, a desired/required dimming ratio. Similarly, a dimming level actually provided may be a level, given the dimming components and priority therebetween that are available, that is as close as possible, given available levels, to a desired dimming level.

Typically, a good user experience is achievable by providing only a few dozen, or even less than 10 or up to 5 distinct e.g. selectable dimming levels within the dynamic dimming range. For example: 30 or 20 or 10 or 5 or 3 selectable dimming levels values may be provided in the dimming factor range of 1 to 3200.

FIG. 7 is an example table showing dimming ratio component triplets (df_pw, df_gain, df_div), dimming control triplets (pixel width, gain, div), and corresponding df_total and projection intensities. Note the first 6 rows pertain respectively, to MAX laser intensity i.e. no dimming (first row), followed by ¾, half, one-third, one-quarter and one-eighth of the max laser intensity respectively, as is evident from the last, laser beam projection intensity column.

FIG. 7 pertains to dimming which utilizes all 3 components described herein, but can also be used for embodiments which utilize only the first 2 components (if div=1) and for embodiments which utilize only one of the components (e.g. if div=1 and gain=100; or if div=1 and pulse width =4). It is appreciated that terminology such as "mandatory", "required", "need" and "must" refer to implementation choices made within the context of a particular implementation or application described herewithin for clarity and are not intended to be limiting since in an alternative implantation, the same elements might be defined as not mandatory and not required or might even be eliminated altogether.

Features of the present invention, including operations, which are described in the context of separate embodiments may also be provided in combination in a single embodiment. For example, a system embodiment is intended to include a corresponding process embodiment and vice versa. Features may also be combined with features known in the art and particularly although not limited to those described in the Background section or in publications mentioned therein.

Conversely, features of the invention, including operations, which are described for brevity in the context of a single embodiment or in a certain order may be provided separately or in any suitable subcombination, including with features known in the art (particularly although not limited to those described in the Background section or in publications mentioned therein) or in a different order. "e.g." is used herein in the sense of a specific example which is not intended to be limiting. Each method may comprise some or all of the operations illustrated or described, suitably ordered e.g. as illustrated or described herein.

It is appreciated that in the description and drawings shown and described herein, functionalities described or illustrated as systems and sub-units thereof can also be provided as methods and operations therewithin, and functionalities described or illustrated as methods and operations therewithin can also be provided as systems and sub-units thereof. The scale used to illustrate various elements in the drawings is merely exemplary and/or appropriate for clarity of presentation and is not intended to be limiting.

The invention claimed is:

1. A method for providing a dimming factor of N using a laser display device having plural colored laser diodes each generating a colored laser beam according to control parameters, the method comprising:
varying at least one of said control parameters of at least one of said laser diodes, wherein said at least one of said control parameters is operative to reduce intensity of at least one of the colored laser beams,
wherein said varying comprises:
providing a dimming factor of m<N using first laser diode data current control apparatus characterized by its ability to provide m<N dimming levels; and
providing a dimming factor of at least N/m but less than N, using a laser diode data current control apparatus set including at least a second laser diode data current control apparatus and characterized by its ability to provide a dimming factor of at least N/m, but less than N.

2. A method according to claim 1, wherein at least one of the laser diode data current control apparatus includes Data Reference DAC gain control.

3. A method according to claim 2, wherein when reducing reference DAC gain for each of plural color channels, resulting pixel data is multiplied by a color-channel specific correction factor gain CF pre-computed to maintain white balance between said channels.

4. A method according to claim 1, wherein the first and second laser diode data current control apparatus include laser pixel width control and Data Reference DAC gain control.

5. A method according to claim 4, wherein the laser diode data current control apparatus set also includes laser pixel data division.

6. A method according to claim 1, further comprising providing N dimming levels using a laser display device, including:
receiving, in real time, a stream of desired dimming levels from among the N dimming levels; and
achieving each desired dimming level in the stream in real time, including using a first laser diode data current control apparatus characterized by its ability to provide a dimming factor of m<N and a laser diode data current control apparatus set including at least a second laser diode data current control apparatus and characterized by its ability to provide a dimming factor of at least N/m, but less than N.

7. A method according to claim 1, wherein at least one of the laser diode data current control apparatus includes laser pixel width control.

8. A method according to claim 7, wherein laser pixel width control is achieved by reducing a number of clocks per laser pixel.

9. A method according to claim 1, wherein said plural colored laser diodes comprise a red laser diode, a green laser diode and a blue laser diode.

10. A system for providing a dimming factor of N using a laser display device having plural colored laser diodes each generating a colored laser beam according to control parameters, the system comprising:
apparatus for varying at least one of said control parameters of at least one of said laser diodes, wherein said at least one of said control parameters is operative to reduce intensity of at least one of the colored laser beams,
wherein said apparatus for varying comprises:
a controller operative for providing a dimming factor of m<N using first laser diode data current control apparatus characterized by its ability to provide m<N dimming levels; and providing a dimming factor of at least N/m but less than N, using a laser diode data current control apparatus set including at least a second laser diode data current control apparatus and characterized by its ability to provide a dimming factor of at least N/m, but less than N.

11. The system according to claim 10, wherein the first and second laser diode data current control apparatus include laser pixel width control and Data Reference DAC gain control.

12. The system according to claim 11, wherein the laser diode data current control apparatus set also includes laser pixel data division.

13. The system according to claim 10, wherein at least one of the laser diode data current control apparatus includes Data Reference DAC gain control.

14. The system according to claim 10, wherein at least one of the laser diode data current control apparatus includes laser pixel width control.

15. The system according to claim 14, wherein laser pixel width control is achieved by reducing a number of clocks per laser pixel.

16. The system according to claim 10, wherein said plural colored laser diodes comprise a red laser diode, a green laser diode and a blue laser diode.

17. A computer program product, comprising a non-transitory tangible computer readable medium having computer readable program code embodied therein, said computer readable program code configured to be executed to implement a method for providing a dimming factor of N using a laser display device having plural colored laser diodes each generating a colored laser beam according to control parameters, the method comprising:

varying at least one of said control parameters of at least one of said laser diodes, wherein said at least one of said control parameters is operative to reduce intensity of at least one of the colored laser beams, wherein said varying comprises:

providing a dimming factor of m<N using first laser diode data current control apparatus characterized by its ability to provide m<N dimming levels; and providing a dimming factor of at least N/m but less than N, using a laser diode data current control apparatus set including at least a second laser diode data current control apparatus and characterized by its ability to provide a dimming factor of at least N/m, but less than N.

18. The computer program product according to claim 17, the method also comprising providing N dimming levels using a laser display device, including:

receiving, in real time, a stream of desired dimming levels from among the N dimming levels; and achieving each desired dimming level in the stream in real time, including using a first laser diode data current control apparatus characterized by its ability to provide a dimming factor of m<N and a laser diode data current control apparatus set including at least a second laser diode data current control apparatus and characterized by its ability to provide a dimming factor of at least N/m, but less than N.

19. The computer program product according to claim 17, wherein at least one of the laser diode data current control apparatus includes Data Reference DAC gain control.

20. The computer program product according to claim 19, wherein when reducing reference DAC gain for each of plural color channels, resulting pixel data is multiplied by a color-channel specific correction factor gain CF pre-computed to maintain white balance between said channels.

* * * * *